US006445323B1

(12) United States Patent
Cairns et al.

(10) Patent No.: US 6,445,323 B1
(45) Date of Patent: Sep. 3, 2002

(54) MULTI-FORMAT ACTIVE MATRIX DISPLAYS

(75) Inventors: Graham Andrew Cairns; Michael James Brownlow, both of Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/943,593

(22) Filed: Aug. 30, 2001

(30) Foreign Application Priority Data

Sep. 5, 2000 (GB) ............................................ 0021713

(51) Int. Cl.[7] ................................................ H03M 1/66
(52) U.S. Cl. ....................................... 341/144; 341/150
(58) Field of Search ................................ 341/144, 153, 341/150

(56) References Cited

U.S. PATENT DOCUMENTS 6,169,509 B1 * 1/2001 Abe ........................... 341/144

* cited by examiner

*Primary Examiner*—Brian Young
(74) *Attorney, Agent, or Firm*—Renner, Otto, Boisselle & Sklar, LLP

(57) ABSTRACT

Multi-format sampling registers, digital to analogue converters, data drivers and active matrix displays are provided which provide power saving in lower resolution formats by disabling circuitry which is not required in those formats.

22 Claims, 15 Drawing Sheets

Gamma correction with linear DAC

Gamma correction with 2-stage non-linear DAC

| Format control signal | | | |
|---|---|---|---|
| NB | MB | SB | Driver format |
| 0 | 0 | 1 | 1 bit per colour |
| 0 | 1 | 0 | m bits per colour |
| 1 | 1 | 0 | n+m bits per colour |
| 0 | 1 | 1 | m bits per colour with 1-bit overlay |
| 1 | 1 | 1 | n+m bits per colour with 1-bit overlay |

Operation with 3 format control signals

FIG 11a

| Format control signal | | Data | |
|---|---|---|---|
| MN | S | D | Driver format |
| 0 | 1 | X | 1 bit per colour |
| 0 | 0 | 0 | m bits per colour |
| 0 | 0 | 1 | m bits per colour with 1-bit overlay |
| 1 | 0 | 0 | n+m bits per colour |
| 1 | 0 | 1 | n+m bits per colour with 1-bit overlay |

Operation with 2 format control signals

FIG 11b

MULTI-FORMAT ACTIVE MATRIX DISPLAYS

BACKGROUND OF THE INVENTION

1. Field of the Invention

The invention relates to multi-format active matrix displays, and multi-format devices for use therewith.

2. Description of the Related Art

The invention provides multi-format data drivers for controlling active matrix displays. The circuits of the drivers may be implemented in discreet driver integrated circuits, connected to the active matrix by direct bonding or via flexible circuit connections. In these cases, the circuits are almost always fabricated from crystalline silicon. Alternatively, the circuits may be integrated on the same substrates as the active matrix devices using the same processing steps. Devices of this type include thin film transistors (TFTs), in particular low and high temperature poly-silicon transistors. The invention is directly applicable to displays of portable equipment where data may be supplied to the display in a variety of formats and where display power consumption must be minimised.

FIG. 1 shows a typical active matrix liquid crystal (LC) display 2 composed of N rows and M columns of pixels. The boxes at the periphery of the active matrix represent the display driver electronics. It is the combined function of the digital data line driver 4 and scan line driver 6 to provide analogue data voltages to the electrodes 8 of the LC pixels from a digital image data source.

The digital data driver 4 typically receives image data from an LC controller integrated circuit (not shown). In addition to the image data, the driver 4 also receives control and timing signals such as a clock signal, and frame and line synchronisation signals. Image data is normally transmitted to the digital data driver 4 a line at a time, with each line corresponding to the required display states of a horizontal line of pixels of the display. The digital data driver 4 contains an array of input registers 10, as shown in FIG. 1. As a line of image data is transmitted to the driver 4, each data element is read into one of the input registers 10. The sampling pulses that activate the input registers 10 are generated by the timing generator 12. Once the entire line of image data has been sampled by the input registers 10, the data is transferred to an array of storage registers 16. During the time that the next line of image data is being transmitted to the driver 4, the data in the storage registers 16 is supplied to digital-to-analogue converter circuits 18.

The digital-to-analogue conversion operation may be non-linear such that it, compensates for the liquid crystal voltage/light-transmission characteristics. This transformation is known as gamma correction. Alternatively, the LC controller (not shown) may support gamma correction, in which case the digital-to-analogue conversion within the digital data driver 4 is a linear operation. The outputs of the converters 18 charge the source lines 20 (i.e. data lines) of the active matrix, and the scan driver 6 controls which row of pixels is charged from the source lines 20 through the pixel TFTs 22.

FIG. 2 shows a graph of light transmission plotted against electrode voltage for a typical twisted nematic liquid crystal pixel. Gamma correction for liquid crystal active matrix displays involves compensating for the pixel non-linear input voltage/light modulation characteristic. In order to annul the non-linearity such that equal changes in digital input correspond to equal changes in light transmission, a conversion circuit must implement the precise inverse of the function shown in FIG. 2. This inverse function is shown as the dashed line in the graph of FIG. 3. Along the x-axis is the digital input (6 bits shown in this example), and the y-axis indicates the analogue voltage required from the output of the digital-to-analogue converter.

There are two main strategies for implementing gamma correction. The first, shown in FIG. 4(*a*), involves a purely digital transformation. A RAM or ROM circuit 24 takes a digital input having (n+m) bits and generates an output which may have a greater number of bits than the input to preserve accuracy. These bits reflect the desired inverse function such that when they are supplied to a connected linear digital-to-analogue converter 26, the analogue output has the desired response to the input.

The second strategy involves gamma correction with a non-linear two-stage digital-to-analogue converter 28, as depicted in FIG. 4(*b*). This means of gamma correction is discussed in more detail below.

In FIG. 4(*b*), the digital-to-analogue converter (DAC) 28 is composed of two stages. A first stage DAC 30 receives the m most significant bits (MSBs) of the input, and a second stage DAC 32 receives the n least significant bits (LSBs). Reference voltages VR corresponding to each of the digital inputs from 0 to $2^m$ are supplied to the first stage DAC 30. These reference voltages are represented by VR ($0:2^m$) in FIG. 4(*b*). The MSBs are decoded in the first stage by the in bit to $2^m$ line decoder 30 and the result is used to select which two of the $2^m+1$ gamma correction reference voltages, VR($0:2^m$), are supplied to the second stage DAC 32 of the converter 28. The two reference voltages VR supplied to the second stage DAC 32 are the VL and VH voltages indicated in FIG. 4(*b*).

Within the second stage DAC 32, the n LSBs are used to perform a linear digital-to-analogue conversion within the limits defined by VL and VH. The second stage digital-to-analogue converter 32 is typically built from capacitors or resistors, and switches. Because the capacitance of the video or source line load is usually high, a buffer circuit 34 is normally employed at the output of the circuit. The slew rate and settling time of the buffer then defines the minimum conversion time required to obtain a desired bit accuracy. The slew rate is the maximum rate of change of the output voltage of a buffer, and has units of V/s.

In the graph of FIG. 3, an example is shown of a 6 bit conversion afforded by such a converter circuit. In this particular example n=3 and m=3. The solid line shows that the actual output is a piecewise linear approximation to the desired output (the dotted line), with the gamma correction reference voltages defining the end-points of the linear element pieces.

FIG. 5 shows a known improved two-stage non-linear digital-to-analogue converter 36 which operates with a smaller conversion time (see British Patent Application No. 0011015.5). In comparison to FIG. 4(*b*), the improved circuit contains two switches which operate on non-overlapping clock phases, $\Phi_1$ and $\Phi_2$ (shown in FIG. 6). The first switch 38 denoted the precharge switch, allows the selected reference voltage VL to directly charge the output load 40 on phase $\Phi_1$. The second switch 42, called the isolation switch, is open during the $\Phi_1$ period so that the buffer output is isolated from the load 40. Because VL is a reference supply, the load is quickly charged to within n bits of its final desired value with a time constant defined by the pre-charge switch resistance and the load capacitance.

During $\Phi_2$, the precharge switch 38 is open, and the buffer 34 applies the (m+n) bit analogue result from the digital-to-digital converter 36 to the load 40. At this moment, the load 40 has already been charged to within n bits of its final desired value, therefore the buffer output can reach this target much more quickly. A comparison of conversion times between this circuit and the one of FIG. 4(*b*) is shown in FIG. 6, in which the top and bottom graphs show the voltage outputs of the circuits of FIGS. 4(*b*) and 5 respectively.

The design of the sampling circuits in the input registers 10 and storage registers 16 of FIG. 1 may vary considerably depending on integration process technology. This is because the supply voltage for the sampling circuits is a process dependent factor, whereas it is desirable from power consumption considerations that the digital input and control signals are low voltage logic, for example a logic low of 0.0 V and a logic high of between 1.0 V and 5.0 V.

In the case of crystalline silicon integrated circuit drivers, where the supply voltage is the same as the logic input levels, the design of the sampling circuits is simpler, for example standard D-type latches or flip-flops may be used. For the case of poly-silicon (or other TFT) integrated drivers, the higher device threshold voltages may warrant a supply voltage that is significantly higher than the input logic levels for example vdd may be anywhere between 5.0 V and 15.0 V. The voltage disparity between input and supply means that voltage level is shifting is required within the sampling circuit.

FIG. 7 shows a prior art sampling circuit 42 (see British Patent Application No. 0005985.7) suitable for sampling an input logic signal (labelled INPUT in the schematic) that is significantly lower than the supply voltage, vdd. When the SAMPLE control signal is high (vdd), the output (denoted OUTPUT) is a level shifted logic equivalent of the input, signal. When the SAMPLE control signal is low (vss), the output is latched. The circuit 42 can be divided into two sub-circuits; a level-shifting sub-circuit constructed with devices M3 to M7, and a latching sub-circuit composed of devices M8 to M13.

The level shifting sub-circuit is activated when SAMPLE is high., P-type devices M4 and M6 are turned on, and N-type device M3 is turned off. Transistors M4 and M5, connected in series between vdd and a reference voltage, vref (which may be vss), together generate a bias voltage at the gate of transistor M7. Device M7 is configured as a common gate amplifier in which its source terminal is the input and its drain terminal, connected to load device M6, is the output. With careful device scaling and selection of vref, the output is a level-shifted logic equivalent of the input, which swings almost to the supply rails. The latching sub-circuit is activated when SAMPLE is low (devices M8 and M11 are turned on), and the logic state of the output is stored by crossed-coupled inverters M9/M10 and M12/M13.

During operation, only one of the sub-circuits is activated and controls the state of the output node, and the other is deactivated. When the level-shifting sub-circuit is activated, i.e. when SAMPLE is high, it is important to note that the power consumption of the circuit is at its highest. This is attributed to the currents flowing between vdd and vref (through M4 and M5) and between vdd and INPUT (through M6 and M7).

On screen display functions are typically used to overlay video data with simple text or graphical information. An example might be the display brightness setting of a digital camera which, when selected, is seen superimposed on the camera image provided from the CCD. This functionality is normally provided by an LC controller integrated circuit, such as the general purpose version shown in FIG. 8. This 'chip' can take input video data in either luminance and chrominance format or RGB formats and supplies either analogue or digital gamma-corrected RGB to the LC data drivers of an active matrix display. Any on-screen display data, supplied by the SRAM memory 44, is used to overwrite the video data in the display mixer circuit 46 shown. The present invention allows this function to be moved conveniently to the LC data driver circuit(s).

SUMMARY OF THE INVENTION

According to the invention there is provided a multi-format sampling register, digital to analogue converter, data driver and active matrix display as set out in the accompanying claims.

Format control signals are used to ensure that only those components are activated which are required for a given format, thus achieving a reduction in power consumption.

BRIEF DESCRIPTION OF THE DRAWINGS

Embodiments of the invention will now be more particularly described, by way of example only, with reference to the following drawings, in which:

FIG. 4(*b*) shows a prior art gamma correction circuit with a non-linear two-stage n+m bit digital-to-analogue converter;

FIG. 11(*a*) shows an example set of format control signals and the corresponding multi-format driver operating mode;

FIG. 11(*b*) shows an alternative example set of format control signals and the corresponding multi-format driver operating mode;

DESCRIPTION OF THE PREFERRED EMBODIMENTS

Figure 9:
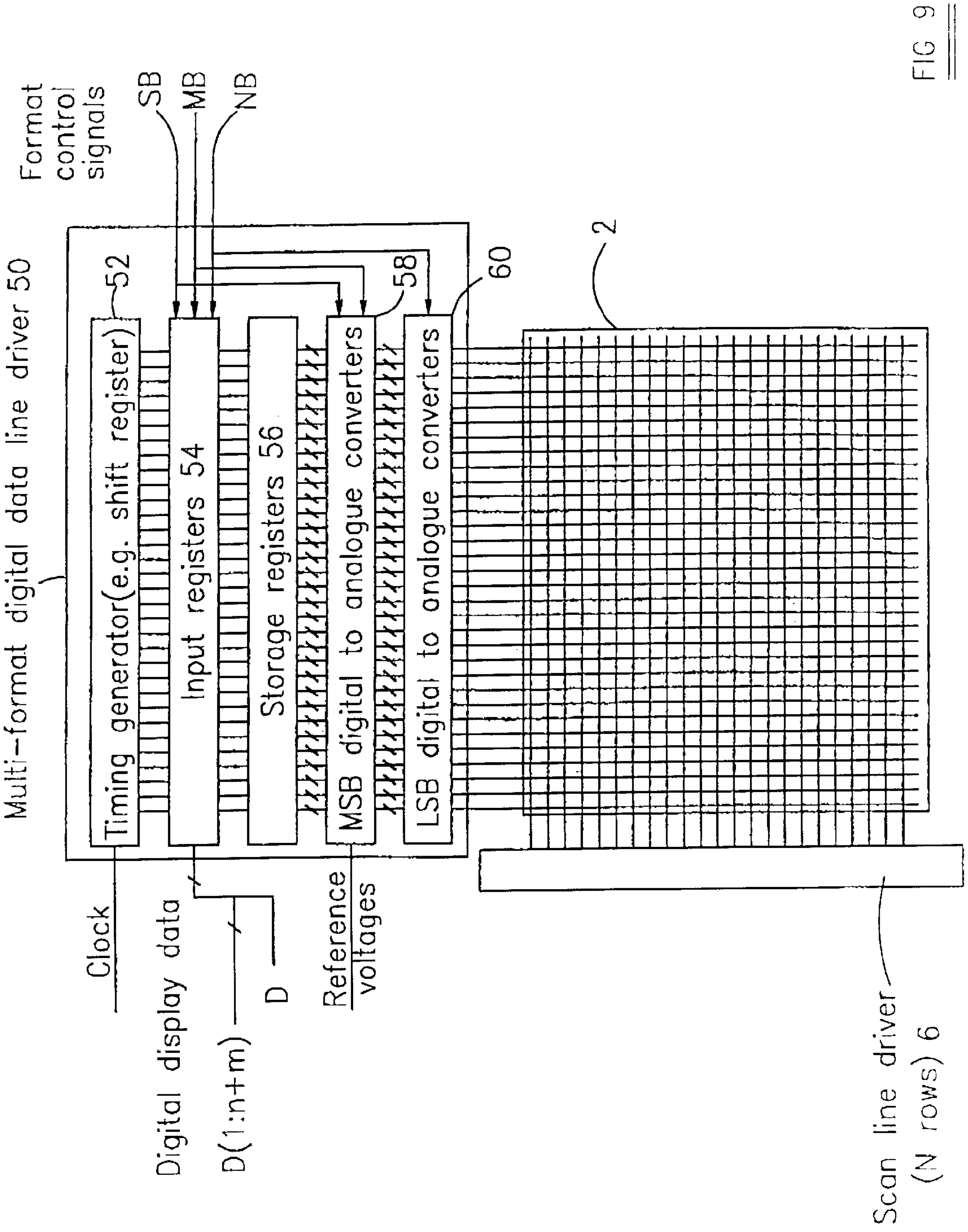
FIG. 9 shows an embodiment of the invention, being a multi-format digital data driver which operates in accordance with format control signals.

FIG. 9 shows a simplified block diagram of an embodiment of the invention. The example shown is monochrome: the extension to colour is straightforward. The multi-format digital data driver 50 is composed of 4 major components: a timing generator 52, an array of input registers 54, an array of storage registers 56 and an array of digital-to-analogue converters. The digital-to-analogue converters are of the two-stage type, described above, and in FIG. 9 the MSB and LSB converter arrays 58 and 60 respectively are drawn separately.

The multi-format driver 50 takes standard clock and control signals, and two, image data inputs: a grey-scale input and a binary input. The grey-scale input, represented D(1:n+m) because it is made up of bits 1 to (n+m) (e.g. bits 1 to 6), is a parallel input of n+m bit width, where m corresponds to the number of most significant data bits of the grey-scale and n to the number of least significant data bits of the grey-scale. This input supplies grey-scale pixel image data with one of two resolutions: high resolution where all n+m bits are read by the driver 50, and low resolution where only the m MSBs are read by the driver 50. The binary input represented D, is a 1 bit input which supplies independent black/white pixel image data.

The two-stage nature of the digital-to-analogue converters permits non-linear conversion, allowing the multi-format driver 50 to provide the gamma correction function. The reference voltages required to do this are shown as being supplied externally in FIG. 9, though they may in fact be generated within the driver 50 itself.

The operation mode of the multi-format driver 50, i.e. the driver format, is controlled by the format control signals, also indicated in the diagram. In the example shown, three format control signals, SB, MB and NB are supplied. These are distributed where necessary to the components of the multi-format driver 50 in order that a particular driver format can be enabled with the lowest possible power consumption. The driver formats are described in the next sections The multi-format driver 50 can operate with various display formats. The choice of driver format may depend on any one of a number of system factors. For example, what image data is available to be displayed? Or, has a system function been selected which demands that graphical data is displayed superimposed on a video image? Or even, what is the power statue of the supply that is powering the system? Depending on which factors are most important for a particular system, the states of the format control signals are set such that optimum display efficiency is obtained.

Figure 10:
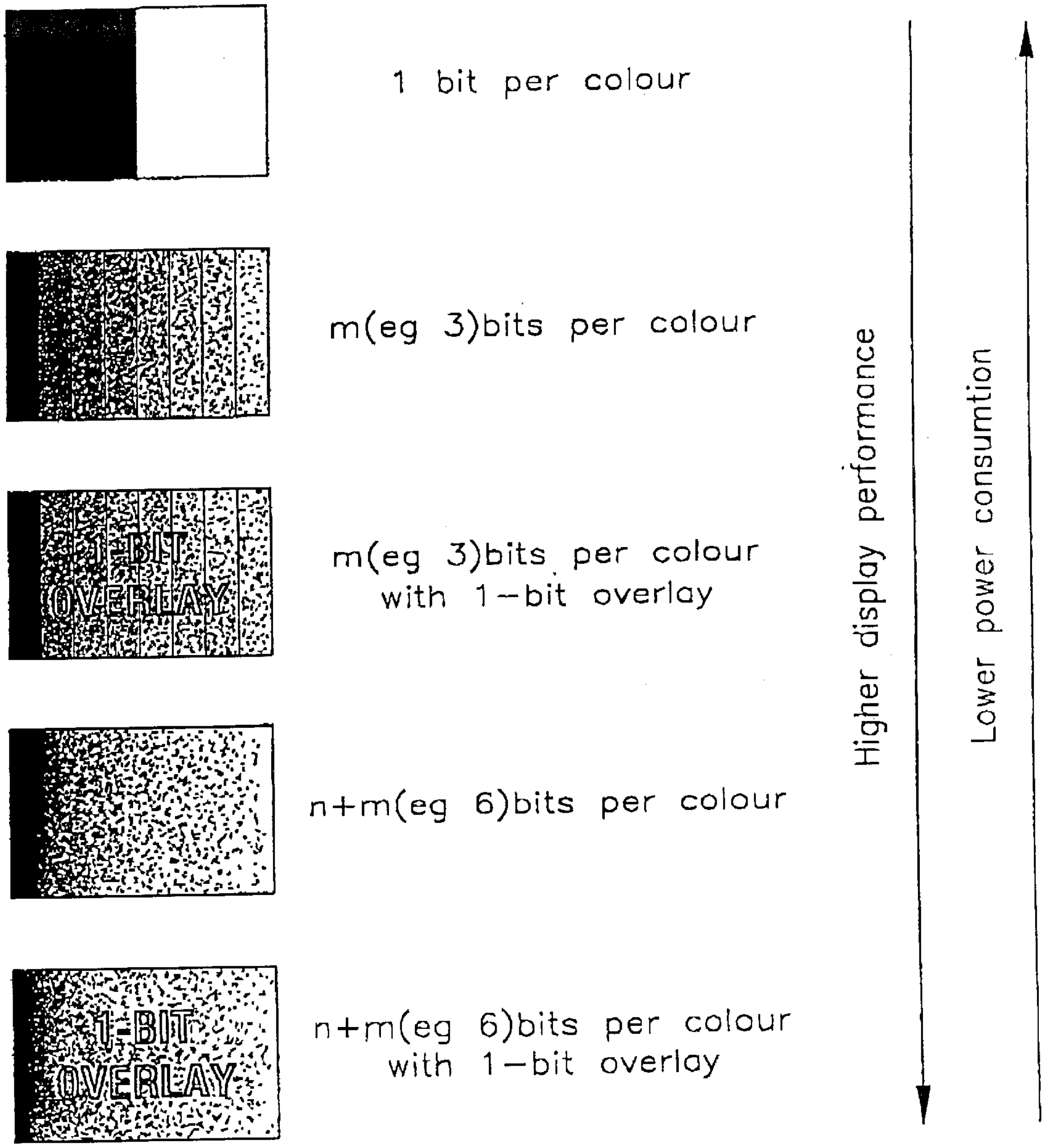
FIG. 10 shows the various display mode capabilities of the multi-format digital data driver, indicating the trade-off between display quality and power consumption.

FIG. 10 shows the 5 different display formats that are supported by the multi-format driver 50, these being:

(i) 1 bit per colour: The driver 50 only reads image data from the single bit D input stream, and writes one of two reference levels to the source lines of the display 2. The pixels can therefore be set to one of two states which will normally be black and white. The reference levels normally change polarity on a frame by frame basis in order that the liquid crystal material within each pixel cell is DC-balanced over time.

(ii) m bits per colour: The driver 50 only reads image data from the m MSBs of the D(1:n+m) input stream and, following an m bit digital-to-analogue conversion, process, writes the analogue data to the source lines of the display 2. The pixels can be set to one of $2^m$ grey levels.

(iii) m bits per colour with 1 bit overlay: The driver 50 reads image data from the m MSBs of the D(1:n+m) input stream and the single bit D input stream. Following an m bit digital-to-analogue conversion process, the driver 50 writes the data to the display 2, overlaid with the D input data where required. The pixels can be set to one of $2^m$ grey levels.

(iv) n+m bits per colour: The driver 50 reads image date from the D(1:n+m) input stream and, following an n+m bit digital-to-analogue conversion process, writes the data to the source lines of the display 2. The pixels can be set to one of $2^{n+m}$ grey levels.

(v) n+m bits per colour with 1 bit overlay: The driver 50 reads image data from the D(1:n+m) input stream and the single bit D input stream. Following an n+m bit digital-to-analogue conversion process., the driver 50 writes the data to the display 2, overlaid with the D input data where required. The pixels can be set to one of $2^{n+m}$ grey levels.

The above display formats are listed in order of increasing display performances, with the last format showing an n+m bit resolution image superimposed with (overlaid by) a second 1 bit image. The multi-format driver 50 ensures that the power consumption for the lower performance display formats is indeed lower. This is achieved by the format control signals which selectively deactivate parts of the driver circuit when they are not required. Embodiments which show this principle are described below.

The table in FIG. 11(*a*) shows how the 3 format control signals, SB, MB and NB, are used to select the 5 possible driver format modes described above. Each format control signal is responsible for enabling specific circuits within the multi-format driver 50. SB enables the circuitry associated with the single input data stream, D, which is used during the 1 bit display mode and when the overlay function is applied. MB enables the circuitry associated with the most significant bits of the grey-scale input, represented D(n+1:n+m) and being made up of bits (n+1) to (n+m) (e.g. bits 4 to 6). NB enables the circuitry associated with the least significant bits of the grey-scale input, represented D(1:n) (e.g. bits 1 to 3). In addition to the input signal combinations shown in the table when all format control signals are 0, the multi-format driver is essentially off.

The table in FIG. 11(*b*) shows an alternative set of format control signals, MN and S. Two signals have the advantage of less driver signals, but one would anticipate that only $2^2=4$ display formats could be encoded. However, use is made of the D input bit itself to determine if the overlay mode is to be activated. When S=1 (and MN=0), the 1 bit per colour mode is selected and the display is over-written with data supplied by the D input stream. In the other four cases, S=0, and MN determines if high or low resolution data is displayed from the D(1:n+m) input: MN=0 selects low resolution (m bit grey-scale); MN=1 selects high resolution (n+m bit grey-scale). In these modes, any positive data at the D input will overwrite the grey-scale data. The D input must be kept low if no overlay is required.

For simplicity, the circuit examples described herein are shown controlled by 3 format control signals. Similar circuits can be controlled by 2 format control signals with additional control logic.

Figure 12:
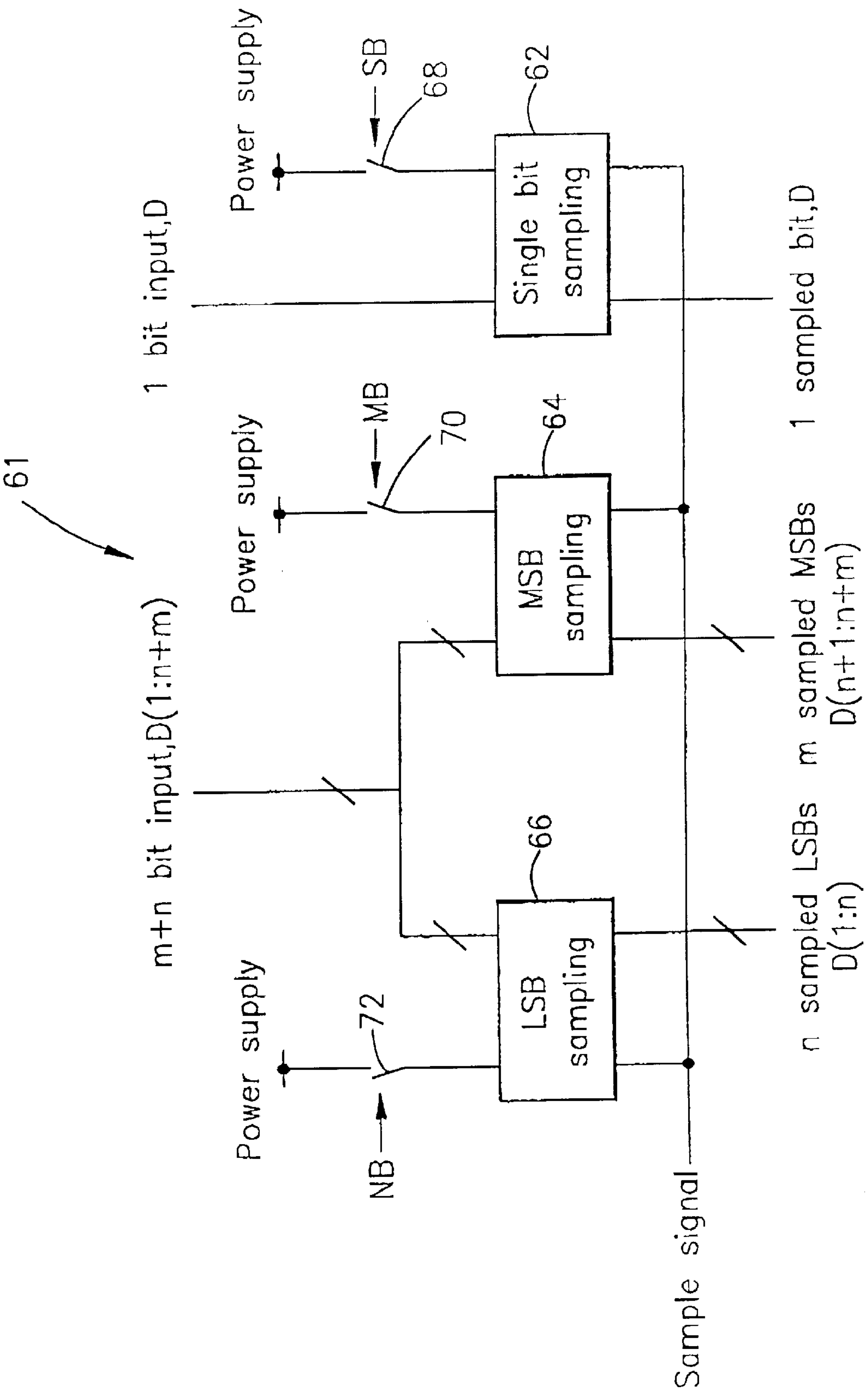
FIG. 12 indicates diagrammatically how the power consumption of the sampling circuit is controlled by the format control signals.

FIG. 12 shows an example of the circuitry of a single input register 61 of the input register array 54. This register is responsible for sampling the incoming digital data from both the grey-scale input, D(1:n+m), and the binary input, D. Within the single bit sampling block 62 there is a single bit sampling circuit of the type shown in FIG. 7. Within the MSB sampling block 64 there are m single bit sampling, circuits, each of the type shown in FIG. 7. Within the LSB sampling block 66 there are n single bit sampling circuits, each of the type shown in FIG. 7. The power supply to, and therefore the power consumption of each sampling block is controlled by the corresponding format control signal. The SB, MB and NB format control signals control switches 66, 70, and 72, which supply power to the single bit, MSB and LSB sampling blocks respectively. The sampling blocks 62, 64, 66 therefore only consume power when they are required to support one of the display formats. There may be a separate input register of the type shown in FIG. 12 for each column of the active matrix display, or alternatively there may be fewer input registers than columns, if the input register are multiplexed (i.e. shared over time) between the columns.

Figure 7:
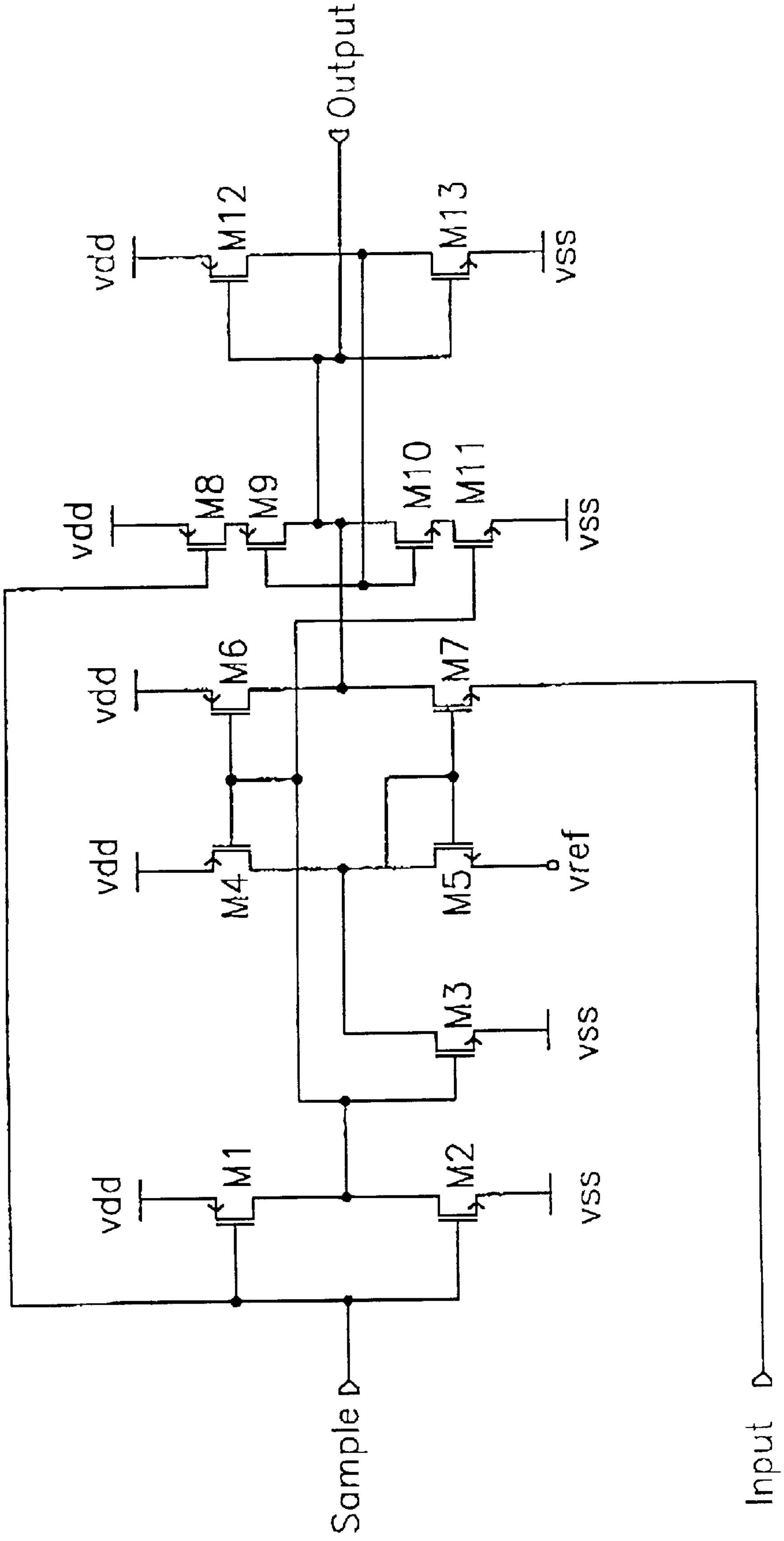
FIG. 7 shows a prior art single bit low voltage sampling circuit.
Figure 8:
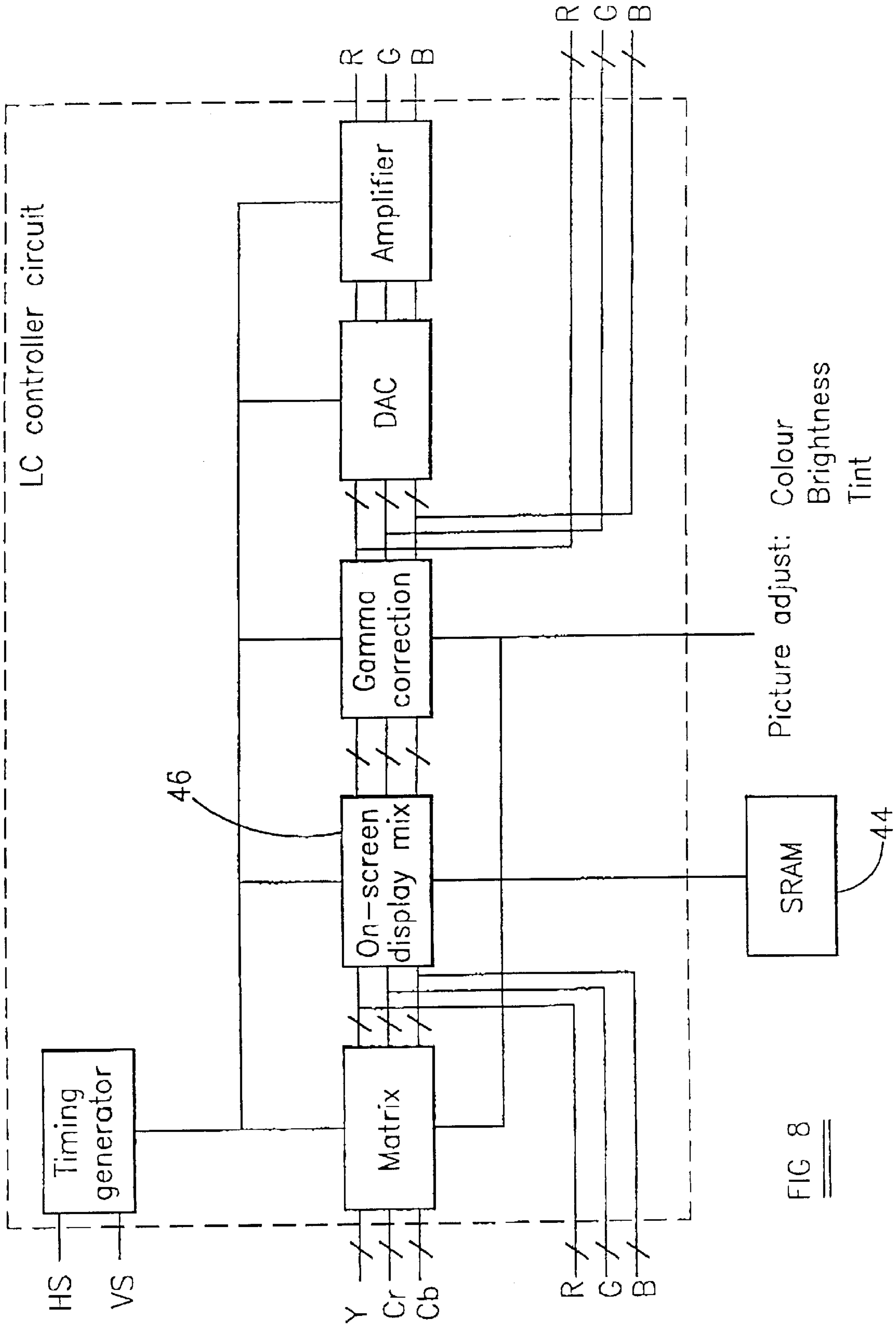
FIG. 8 shows a prior art typical LC controller integrated circuit including 'on-screen display' capability.
Figure 13:
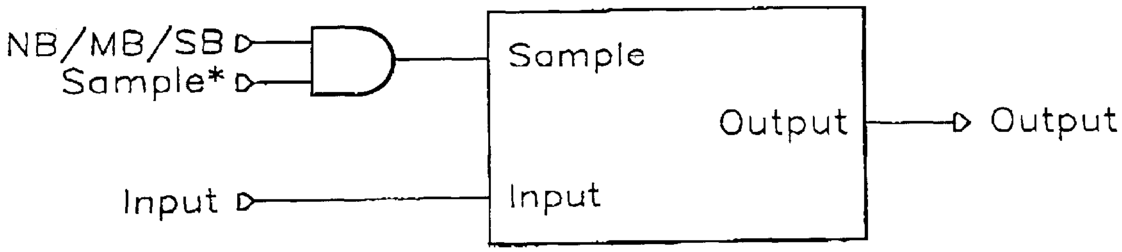
FIG. 13 shows how the bias current power consumption of the sampling circuit of FIG. 7 can be controlled by one of the format control signals.

FIG. 13 shows a simple method of controlling the power consumption of the single bit sampling circuit of FIGS. 7. The format control signal is logically ANDed with the SAMPLE* signal so that the single bit sampling circuit only receives a SAMPLE pulse if the format control signal is high. As discussed above, in order that low-voltage sampling can be achieved, this particular circuit consumes significant power through the M4/M5 and M6/M7 transistors when the SAMPLE input is high. The format control signals therefore prevent this power dissipation in the single bit sampling circuits for those bits that are not required.

Figure 5:
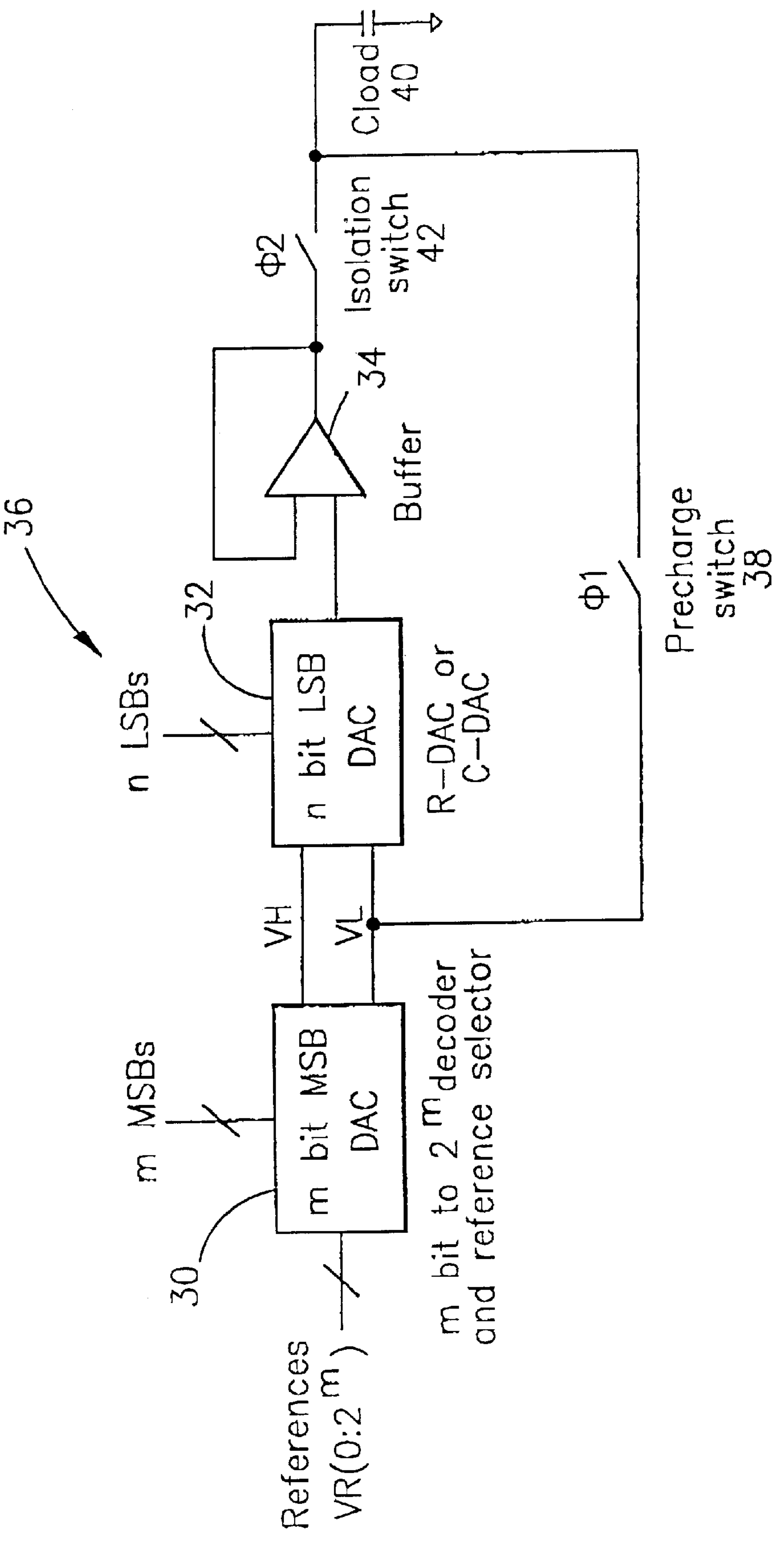
FIG. 5 shows a prior art non-linear two-stage n+m bit digital-to-analogue converter with improved conversion speed.
Figure 6:
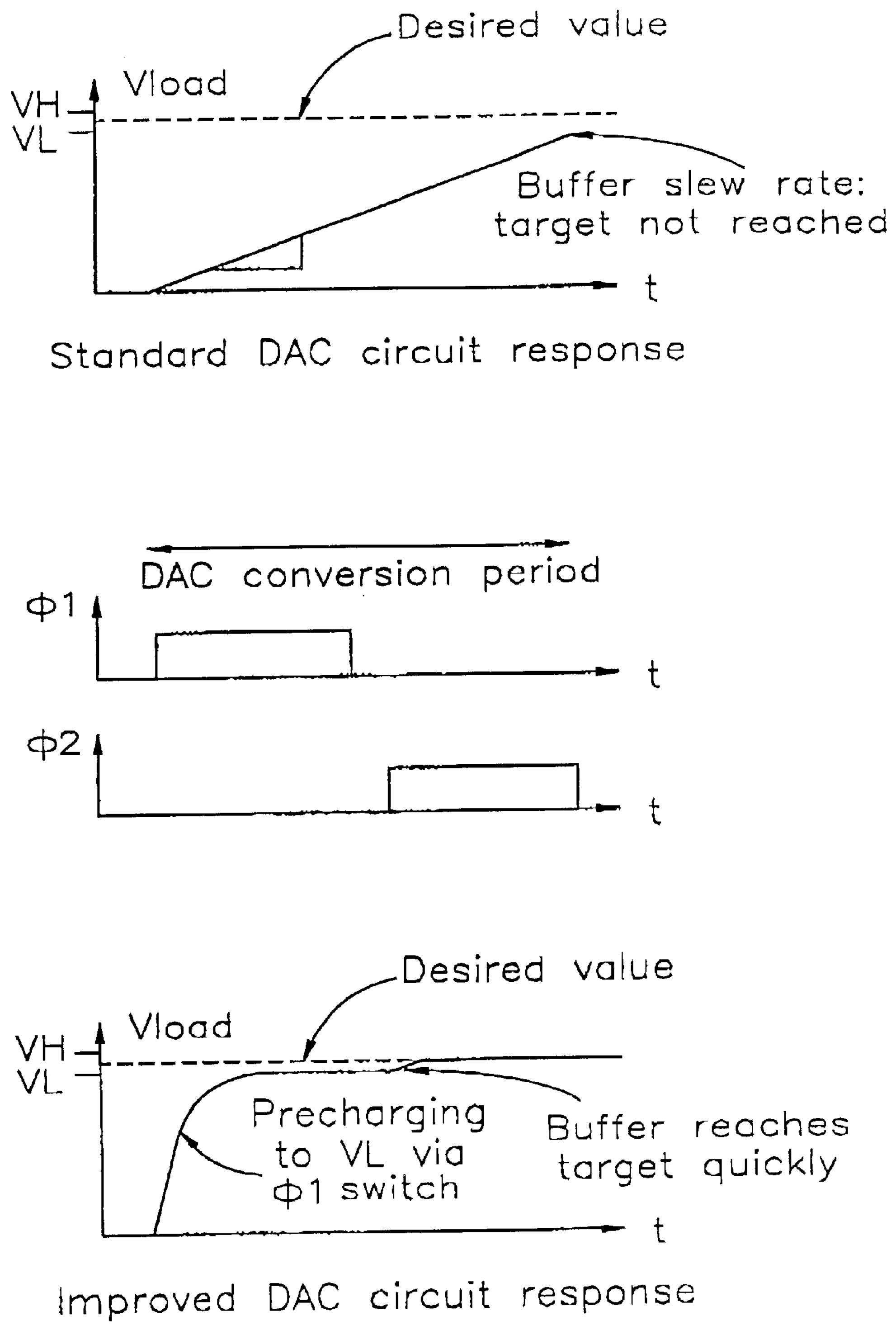
FIG. 6 shows a comparison of the conversion times required by the digital-to analogue converter of FIGS. 4(*b*) and 5.
Figure 14:
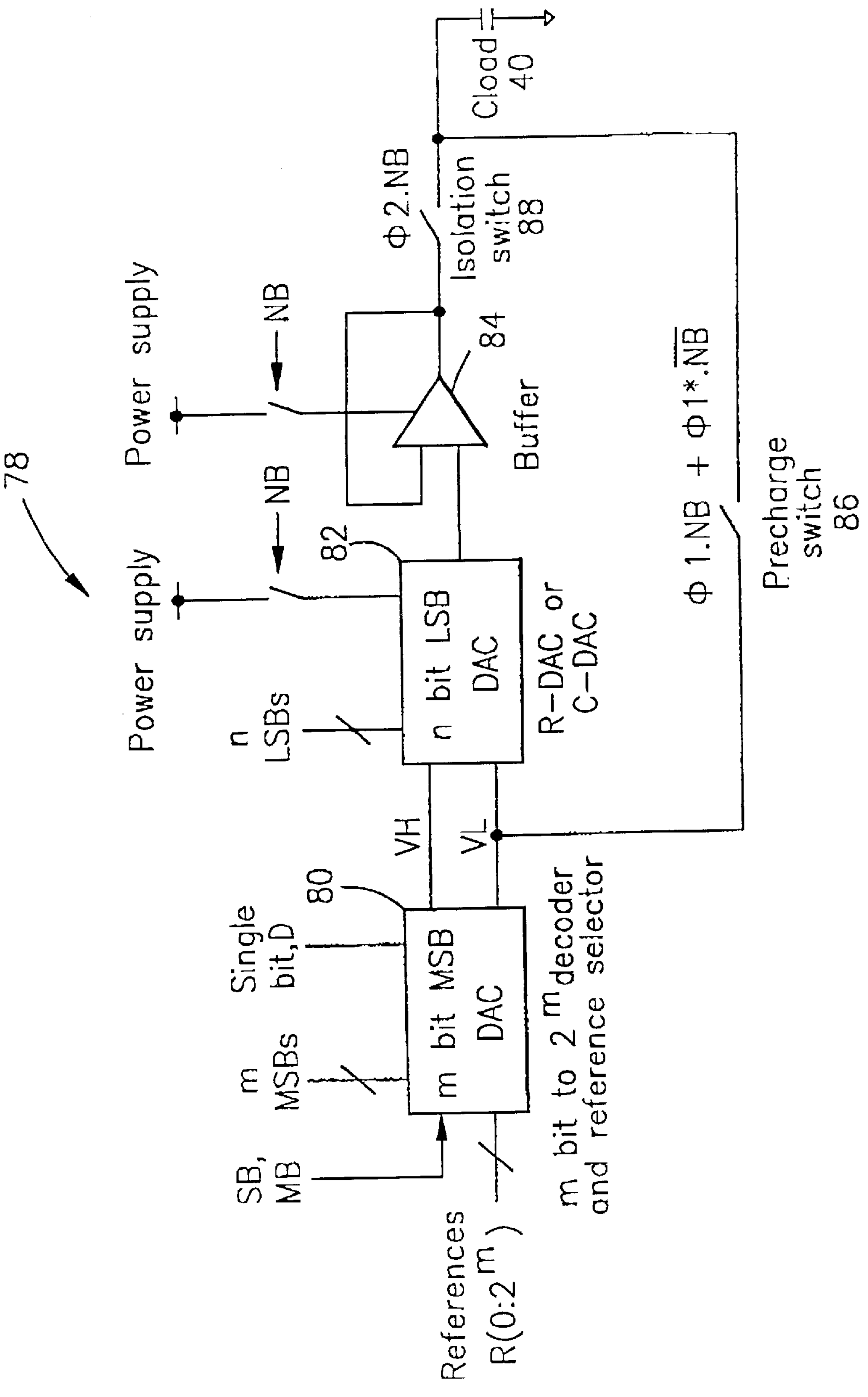
FIG. 14 shows how the prior art digital-to-analogue converter of FIG. 5 can be adapted for operation in the multi-format digital data driver.

The digital-to-analogue converter 78 that is used in the multi-format drivers 50 is shown in FIG. 14. This circuit is a modification of the prior art circuit of FIG. 5. As such, the converter can support gamma correction, as previously discussed, with the appropriate VR reference voltages. In order to support the 5 display formats discussed above, the capacitive load 40 (which may be a video line or a source line) can be changed to three degrees of resolution: n+m bits, m bits or 1 bit. These are discussed below.

Figure 15:
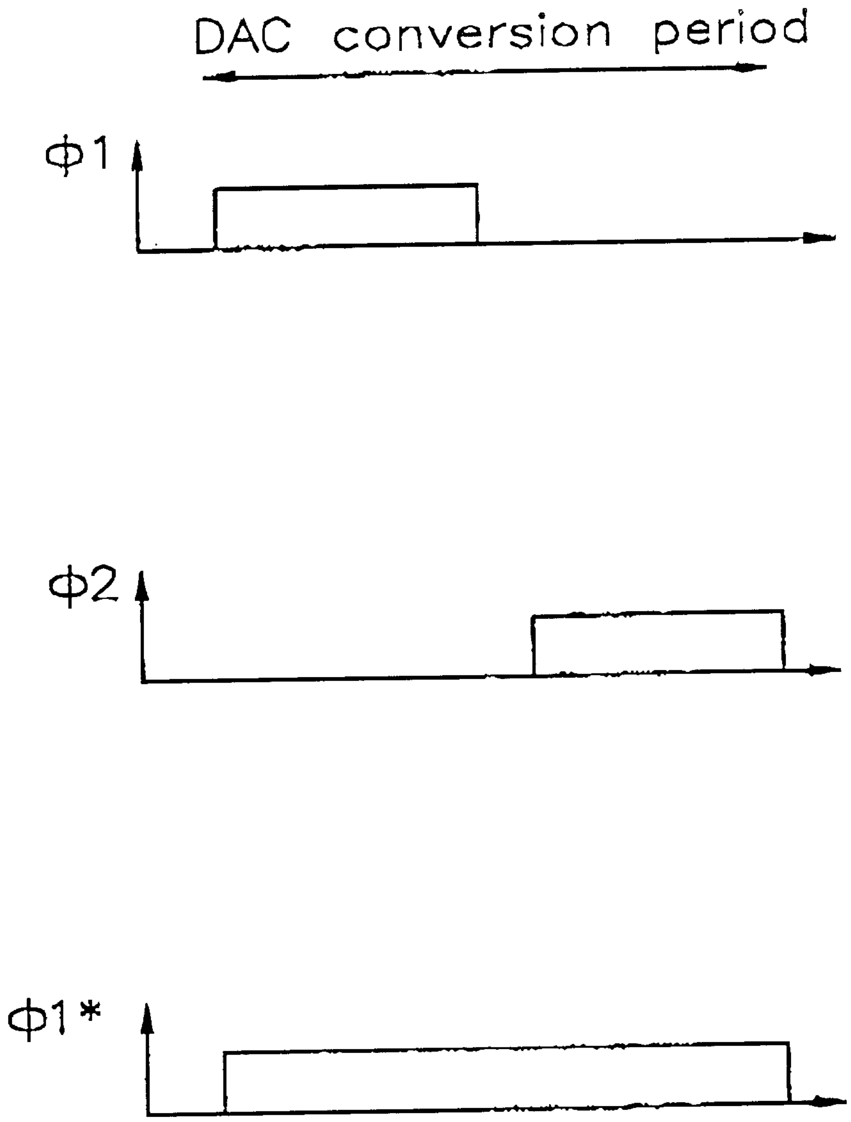
FIG. 15 shows a timing diagram that indicates the phasing of the switches in the digital-to-analogue converter of FIG. 14.

In high resolution (n'm bit) mode, the NB and MB format control signals are activated. It is assumed that SB is low (no overlay). The signals ensure that the MSB decoder circuit 80, LSB digital-to-analogue converter 82 and the buffer circuit 84 are activated. Because of the bias current(s) within the buffer 84, the circuitry is in its highest power consumption configuration. Two non-overlapping time periods $\Phi_1$ and $\Phi_2$ are used, as shown in FIG. 15. On $\Phi_1$, in response to the MSBs, the MSB decoder circuit selects the VL and VH voltages and supplies them to the LSB digital-to-analogue converter 82. The precharge switch 86 also ensures that the load 40 is quickly charged to VL, i.e. to within approximately n bits of the desired target voltage. On $\Phi_2$, the LSB digital-to-analogue converter 82 performs the least significant bit conversion (between VL and VH) and the buffer 84 supplies the converted voltage to the load 40 via the isolation switch 88. The load 40 can thus be charged to one of $2^{n+m}$ different voltage levels.

In low resolution (m bit) mode, the MB and NB format control signals are high and low respectively, it is assumed that SB is low (no overlay). Consequently, the MSB decoder circuit 80 is activated, but the LSB digital-to-analogue converter 82 and the buffer 84 circuit are deactivated. Because the buffer circuit bias currents are turned off, the circuitry consumes much less power in this configuration. During conversion, the isolation switch 88 permanently disconnects the buffer output from the load 40. The precharge switch 86, on the other hand, charges the load 40 with the VL reference voltage selected from the MSB decoder circuit 80. In this way the load 40 can be changed to one of $2^m$ different voltage levels. The duration of closure of the precharge switch can be conveniently extended to ensure that the load 40 is fully charged to the VL reference value within the conversion period. This is because the $\Phi_2$ period (buffer operation) is not required. FIG. 15 shows the longer $\Phi_1$* signal which activates the precharge switch in this particular mode.

Figure 1:
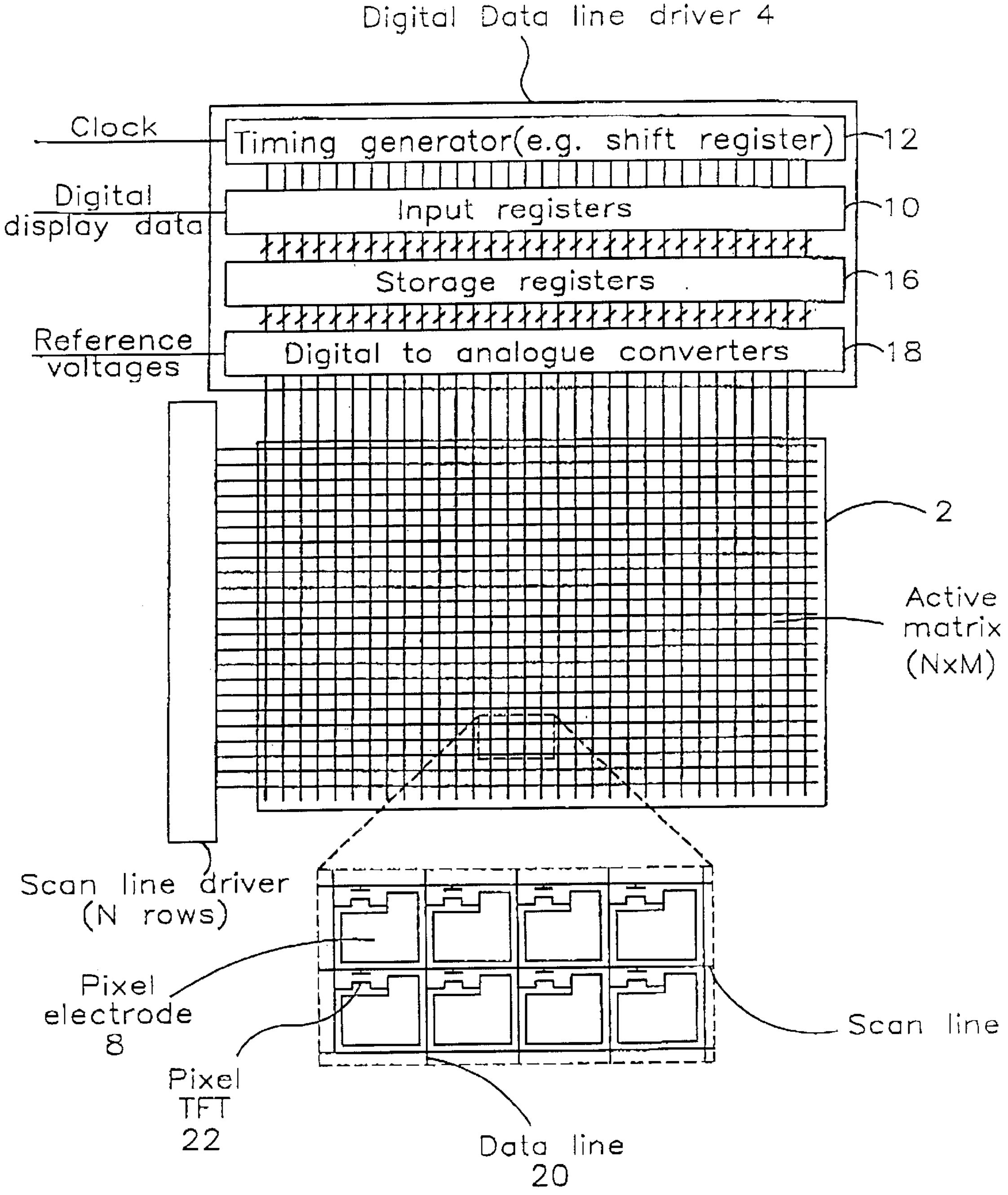
FIG. 1 shows a prior art conventional digital data driver and an active matrix display.
Figure 2:
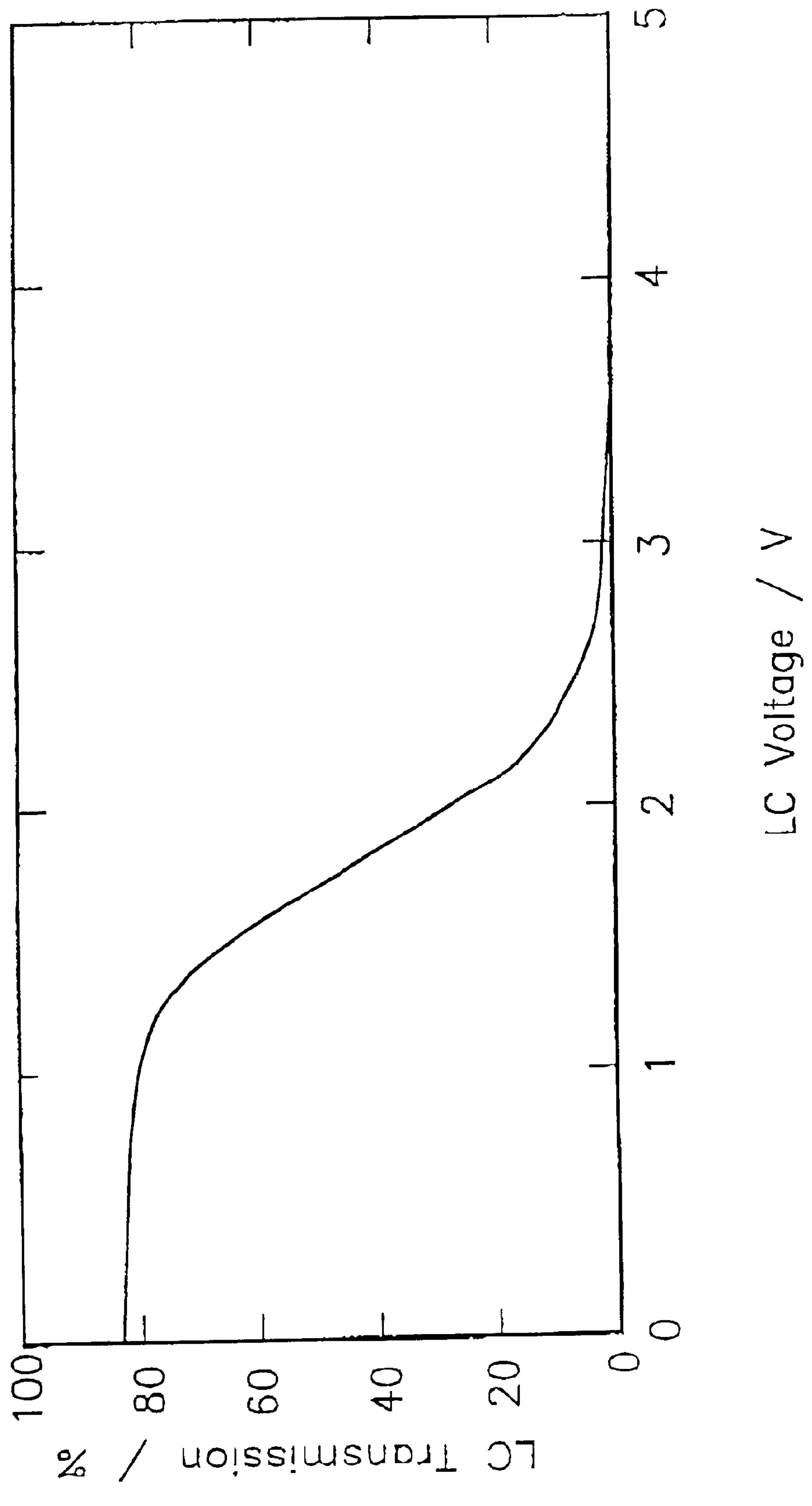
FIG. 2 shows the voltage-transmission curve for a typical liquid crystal display pixel.
Figure 3:
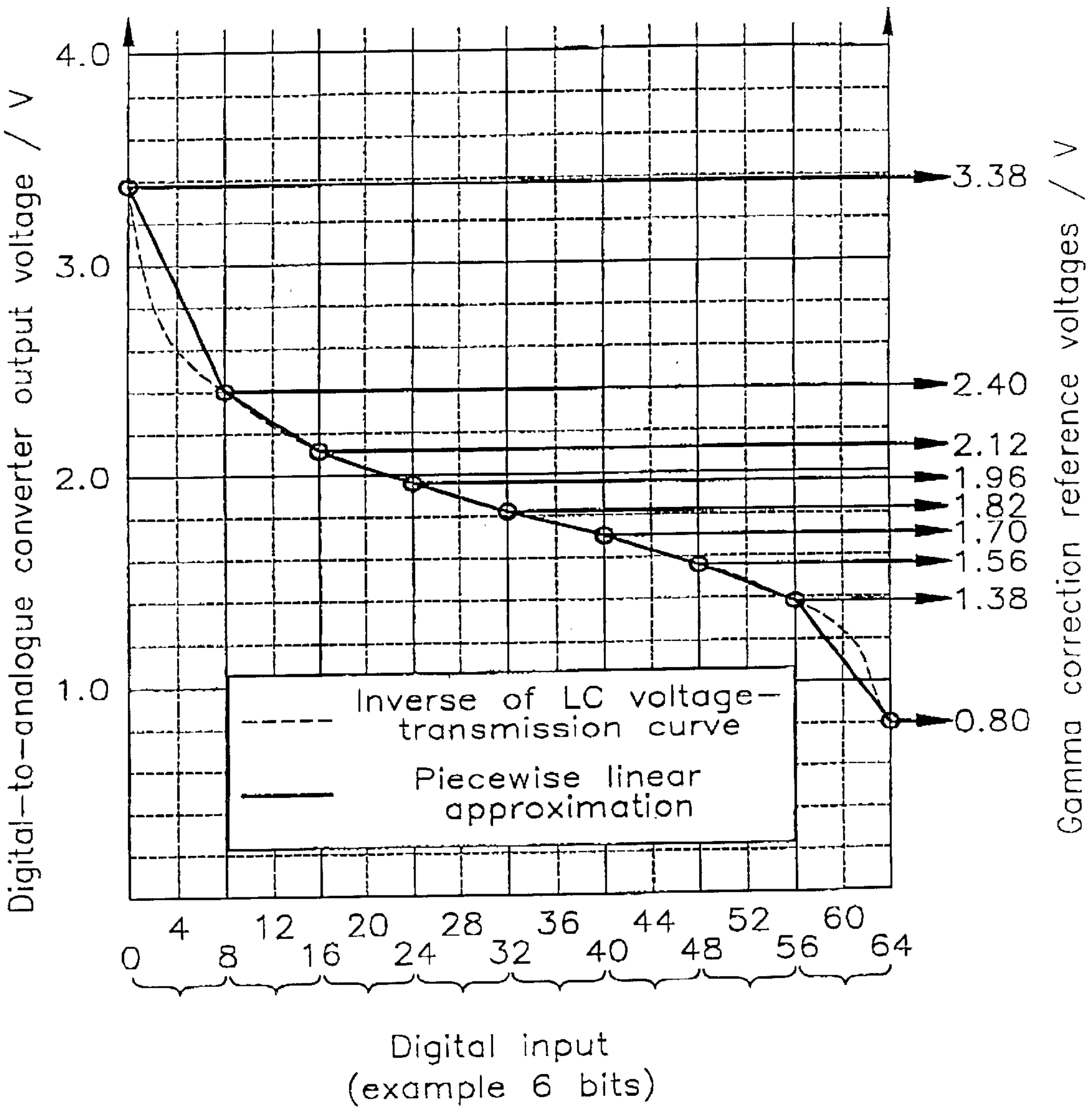
FIG. 3 shows a piecewise linear approximation to the inverse of the voltage-transmission curve of FIG. 2, achievable with a prior art 2-stage digital-to-analogue converter.
Figure 4A:
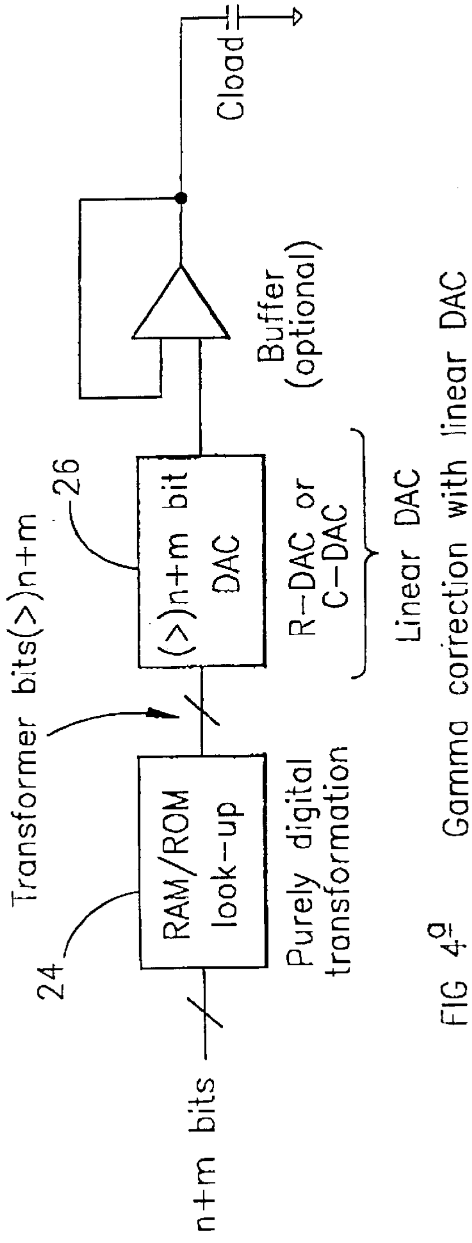
FIG. 4(*a*) shows a prior art gamma correction circuit with digital input transformation and a linear single-stage n+m bit digital-to-analogue converter.
Figure 4B:
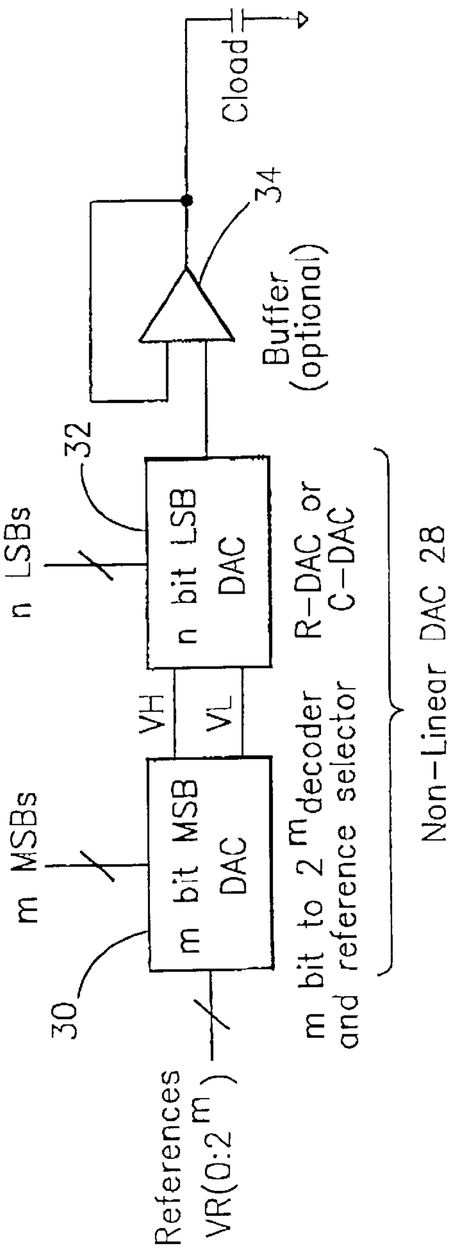

In one bit resolution mode, the MB and NB format control signals are both low and the SB signal is high. Only the MSB decoder circuit 80 is activated, so again the converter 78 consumes very little power. The operation of the MSB decoder circuit 80 changes to accommodate binary operation. The input MSBs are ignored, and the output supplied to VL depends on the state of D. For example, if D is high, the lowest VR reference voltage is supplied to output VL, and therefore to the load 40. This ensures that a pixel driven by the load 40 is switched white (or becomes fully transmissive assuming the pixel has the LC response shown in the graph of FIG. 2). Conversely, if D is low, the highest VR reference voltage is supplied to output VL end therefore to the load 40. This ensures that the same pixel driven by the load 40 is switched black (or becomes fully opaque). Because the load 40 is only charged through the precharge switch 86, the switch 86 can be closed for longer using the $\Phi_1{}^*$ signal described above.

The overlay mode is used in conjunction with the (n+m) bit and m bit modes described above when the SB format control signal is high. When this is the case and D is low, the converter circuit 78 operates exactly as described above for the (n+m) bit and m bit modes, that is as if SB were low. When D is high, however, the operation of the MSB decoder circuit 80 is modified. The lowest VR reference voltage is supplied to output VL, and therefore to the load 40, via the precharge switch 86. This ensures that, irrespective of the grey-scale image data, D(1:n+m), pixels charged, from the load 40 are switched white (or become fully transmissive) White (or full colour RBG) overlay can therefore be achieved on top of the grey-scale image.

For n+m bit operation, when D is high, the buffer 84 is not required. Therefore, logic to prevent connection to the load 40 and/or to disable the buffer 84 altogether, can be added to the circuit 78.

It will be appreciated that the described embodiment provides a digital data driver architecture for an active matrix display in which the mode of operation of the driver circuit (and therefore the power consumption of the driver and display) is controlled in accordance with simple additional format control signals supplied to the driver. The different modes are monochrome, colour of various resolution (bit-plane) settings, and a 1 bit superimpose function used in conjunction with any of the other modes. The format control signals can be used to adjust the mode of operation of the driver such that the picture quality and power consumption of the display are optimised. This is particularly relevant to poly-silicon integrated drivers where level shifting circuits, bias generating circuits and buffer tail currents can be disabled to save power. Furthermore, text data overlay of picture data is possible without any data processing within the display controller.

It will, be appreciated that, whilst the embodiment described divides the (n+m) bit input into two to provide two different resolutions, further embodiments are possible in which the input is divided into three or more in order to provide three or more different resolutions.

What is claimed is:

1. A multi-format sampling register for a data driver for driving data lines of an active matrix display, the sampling register being arranged to operate in either high, or low resolution modes and comprising:

(a) sampler input means arranged to receive a digital input containing at least (n+m) bits and representing the switching level of a pixel of the display, where n and m are integers;

(b) a first sampler comprising in sampling circuits, each arranged to sample one of m bits of said digital input;

(c) a second sampler comprising n sampling circuits, each arranged to sample one of n bits of said digital input, wherein said m bits are more significant than said n bits; and (d) a second sampler switch arranged to switch said second sampler on in said high resolution mode and off in said low resolution mode, so as to ensure that the second sampler consumes substantially no, or at least less, power when the sampling register operates in said low resolution mode.

2. A multi-format sampling register as claimed in claim 1, wherein said second sampler switch is controlled in response to a separate n bit format control signal, which is activated when it is required to make use of said n bits of the digital input.

3. A multi-format sampling register as claimed in claim 1, which further comprises:

a single bit sampling circuit arranged to sample a single bit input; and a single bit switch arranged to switch the single bit sampling circuit on or off.

4. A multi-format sampling register as claimed in claim 3, which is capable of operating in an overlay mode in which overlay information represented by said single bit input is displayed on the display in a single colour, and wherein said single bit switch is arranged to switch the single bit sampling circuit on in said overlay mode and off at other times, so as to ensure that the single bit sampling circuit consumes substantially no, or at least less, power when the sampling register is not in said overlay mode.

5. A multi-format sampling register as claimed in claim 4, wherein said single bit switch is controlled in response to a separate single bit format control signal, which is activated when it is required to make use of said single bit input.

6. A multi-format sampling register as claimed in claims 3, which is capable of operating in a single bit display mode in which all pixels of the display are set to only two different switching levels represented by said single bit input, and which further comprises a first sampler switch arranged to switch said first sampler off in said single bit display mode, and wherein said second sampler switch is also arranged to switch off said second sampler in said single bit display mode, so as to ensure that said first and second samplers consume substantially no, or at least less, power in said single bit display mode.

7. A multi-format sampling register an claimed in claim 6, wherein said first sampler switch is controlled in response to a separate m bit format control signal, which is activated when it is required to make use of said m bits of the digital input.

8. A multi-format digital to analogue converter for a data driver for driving data, lines of an active matrix display, the digital to analogue converter being arranged to operate in either low or high resolution modes, and comprising:

(a) converter input means arranged to receive a digital input containing at least (n+m) bits and representing the switching level of a pixel of the display, where n and m are integers;

(b) a decoder arranged to receive m bits of said digital input, and also to receive ($2^m$+1) reference voltages each corresponding to a different value of said m bits, and having lower and higher decoder outputs which provide lower and higher decoder output voltages respectively, which are a consecutive pair of said reference voltages, with one of said consecutive pair corresponding to the value of said m bits;

(c) an n bit digital-to-analogue converter arranged to receive n bits of said digital input, wherein said m bits are more significant than said n bits, and having a converter output which provides a converter output voltage corresponding to said (n+m) bit digital input for supply to said pixel of the display; and (d) an n bit converter switch for switching said n bit digital-to-analogue converter on in said high resolution mode and off during said low resolution mode, so as to ensure that said n bit digital-to-analogue converter consumes substantially no, or at least less, power in said low resolution mode.

9. A multi-format digital-to-analogue converter as claimed in claim 8, wherein said n bit converter switch in controlled in response to a separate n bit format control signal, which is activated when it is required to make use of said n bits of the digital input.

10. A multi-format digital-to-analogue converter as claimed in claim 8, which further comprises a buffer arranged to receive said converter output voltage, and supply a buffer output to the data line corresponding with said pixel.

11. A multi-format digital-to-analogue converter as claimed in claim 10, which further comprises a buffer switch arranged to switch said buffer on in said high resolution mode and off in said low resolution mode, so as to ensure that the buffer consumes no, or at least less, power in said low resolution mode.

12. A multi-format digital-to-analogue converter as claimed in claim 11, wherein said buffer switch is controlled in response to a separate n bit format control signal, which is activated when it is required to make use of said n bits of the digital input.

13. A multi-format digital-to-analogue converter as claimed in claim 8, which further comprises:

a precharge switch located between said lower decoder output and the data line corresponding with said pixel, and an isolation switch which is located between said converter output and the data line corresponding with said pixel.

14. A multi-format digital-to-analogue converter as claimed in claim 13, which further comprises a timing circuit for providing first and second non-overlapping time periods, and wherein in said high resolution mode said precharge switch is closed only during said first time period and said isolation switch is closed only during said second time period.

15. A multi-format digital-to-analogue converter as claimed in claim 14, wherein during said low resolution mode, the isolation switch remains open, and the precharge switch is closed for an extended period, which is longer than said first time period.

16. A multi-format digital-to-analogue converter as claimed in claim 8 which is capable of operating in an overlay mode in which overlay information represented by a single bit input is displayed on the display in a single colour, wherein in said overlay mode said decoder is arranged to receive said single bit input and to provide a decoder output voltage which causes said pixel to switch to said colour when indicated by said single bit input.

17. A multi-format digital-to-analogue converter as claimed in claim 16, which is capable of operating in a single bit display mode in which all pixels of the display are set to only two different switching levels represented by said single bit input, wherein in said single bit display mode said decoder is arranged to receive said single bit input and to provide a decoder output voltage which is at one of two levels depending on the value of the single bit input, and wherein said n bit converter switch is arranged to switch off the n bit digital to analogue converter in said single bit display mode.

18. A multi-format digital-to-analogue converter as claimed in claim 11 which is capable of operating in a single bit display mode in which all pixels of the display are set to only two different switching levels represented by said single bit input, wherein in said single bit display mode said decoder is arranged to receive said single bit input and to provide a decoder output voltage which is at one of two levels depending on the value of the single bit input, and wherein said n bit converter switch is arranged to switch off the n bit digital to analogue converter in said single bit display mode, wherein said buffer switch is arranged to switch off said buffer in said single bit display mode.

19. A multi-format data driver for driving data lines of an active matrix display, comprising:

a multi-format sampling register for a data driver for driving data lines of an active matrix display, the sampling register being arranged to operate in either high, or low resolution modes, and wherein the multi-format sampling resistor includes, (a) sampler input means arranged to receive a digital input containing at least (n+m) bits and representing the switching level of a pixel of the display, where n and m are integers:

(b) a first sampler comprising m sampling circuits, each arranged to sample one of m bits of said digital input;

(c) a second sampler comprising n sampling circuits, each arranged to sample one of n bits of said digital input, wherein said m bits are more significant than said n bits: and (d) a second sampler switch arranged to switch said second sampler on in said high resolution mode and off in said low resolution mode, so as to ensure that the second sampler consumes substantially no, or at least less, power when the sampling register operates in said low resolution mode, and a multi-format digital to analogue converter for a data driver for driving data lines of an active matrix display, the digital to analogue converter being arranged to operate in either low or high resolution modes, and wherein the multi-format digital to analogue converter includes, (e) converter input means arranged to receive a digital input containing at least (n+m) bits and representing the switching level of a pixel of the display, where n and m are integers;

(f) a decoder arranged to receive m bits of said digital input, and also to receive ($2^m$+1) reference voltages each corresponding to a different value of said m bits, and having lower and higher decoder outputs which provide lower and higher decoder output voltages respectively, which are a consecutive pair of said reference voltages, with, one of said consecutive pair corresponding to the value of said m bits, (g) an n bit digital-to-analogue converter arranged to receive n bits of said digital input, wherein said m bits are more significant than said n bits, and having a converter output which provides a converter output voltage corresponding to said (n+m) bit digital input for supply to said pixel of the display, and (h) an n bit converter switch for switching said n bit digital-to-analogue converter on in said high resolution mode and off during said low resolution mode, so as to ensure that said n bit digital-to-analogue converter consumes substantially no, or at least less, power in said low resolution mode.

20. A multi-format active matrix display comprising a multi-format data driver as claimed in claim 19.

21. A multi-format active matrix display as claimed in claim 20, wherein said multi-format data driver is integrated monolithically on the same substrate as thin film transistors of the active matrix.

22. A multi-format active matrix display as claimed in claim 21, wherein the thin film transistors are poly-silicon.

* * * * *